US012310168B2

(12) United States Patent
Niboshi et al.

(10) Patent No.: US 12,310,168 B2
(45) Date of Patent: May 20, 2025

(54) DISPLAY DEVICE

(71) Applicant: SHARP KABUSHIKI KAISHA, Sakai (JP)

(72) Inventors: Manabu Niboshi, Sakai (JP); Tokiyoshi Umeda, Sakai (JP); Yuto Tsukamoto, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 425 days.

(21) Appl. No.: 17/794,201

(22) PCT Filed: Feb. 7, 2020

(86) PCT No.: PCT/JP2020/004867
§ 371 (c)(1),
(2) Date: Jul. 20, 2022

(87) PCT Pub. No.: WO2021/157063
PCT Pub. Date: Aug. 12, 2021

(65) Prior Publication Data
US 2023/0057758 A1    Feb. 23, 2023

(51) Int. Cl.
| | | |
|---|---|---|
| H01L 51/50 | (2006.01) |
| H01L 27/32 | (2006.01) |
| H01L 51/52 | (2006.01) |
| H10K 50/125 | (2023.01) |
| H10K 50/818 | (2023.01) |
| H10K 50/84 | (2023.01) |
| H10K 50/856 | (2023.01) |
| H10K 59/12 | (2023.01) |
| H10K 59/80 | (2023.01) |
| H10K 102/10 | (2023.01) |

(52) U.S. Cl.
CPC ........ *H10K 50/818* (2023.02); *H10K 50/125* (2023.02); *H10K 50/841* (2023.02); *H10K 50/856* (2023.02); *H10K 59/12* (2023.02); *H10K 59/878* (2023.02); *H10K 59/80518* (2023.02); *H10K 2102/103* (2023.02)

(58) Field of Classification Search
CPC .. H10K 50/125; H10K 50/818; H10K 50/841; H10K 50/856; H10K 50/81–818; H10K 50/82–828; H10K 59/12; H10K 59/878; H10K 59/35; H10K 59/80518; H10K 59/131–1315; H10K 2102/103; G09F 9/30; H05B 33/12; H05B 33/26
See application file for complete search history.

(56) References Cited

U.S. PATENT DOCUMENTS

2017/0146856 A1\*  5/2017  Yokota ............. G02F 1/133514
2018/0188610 A1\*  7/2018  Shimizu ................. G09G 3/34
(Continued)

FOREIGN PATENT DOCUMENTS

JP        2019204763 A       11/2019

*Primary Examiner* — Shahed Ahmed
*Assistant Examiner* — Rhys Poniente Sheker
(74) *Attorney, Agent, or Firm* — ScienBiziP, P.C.

(57) ABSTRACT

A display device includes a light-emitting element layer including light-emitting elements in a plurality of kinds each emitting a light in a different color. A first electrode of the light-emitting elements includes a plurality of reflective layers including one RM and one TE stacked on the RM. The plurality of the reflective layers are stacked so that the RM and the TE are alternatively arranged in the stated order.

11 Claims, 8 Drawing Sheets

(56) References Cited

U.S. PATENT DOCUMENTS

| | | | |
|---|---|---|---|
| 2019/0123305 A1* | 4/2019 | Fukuda | H10K 50/81 |
| 2019/0317362 A1* | 10/2019 | Huang | G02F 1/133603 |
| 2020/0136095 A1* | 4/2020 | Ju | H10K 59/131 |
| 2020/0224094 A1* | 7/2020 | Won | C09K 11/54 |
| 2020/0357863 A1 | 11/2020 | Nakamura et al. | |
| 2021/0020614 A1* | 1/2021 | Yueh | H01L 25/0753 |

* cited by examiner

DISPLAY DEVICE

TECHNICAL FIELD

The present disclosure relates to a display device.

BACKGROUND ART

Conventionally, as light-emitting display devices including light-emitting elements, top-emission display devices are known. A top-emission display device emits light from toward upper faces of the light-emitting elements (see, for example, Patent Document 1).

As described in Patent Document 1, the top-emission display device can be higher in pixel aperture ratio than a bottom-emission display device that emits light from toward an lower face of the light emitting elements.

CITATION LIST

Patent Literature

[Patent Document 1] Japanese Unexamined Patent Application Publication No. 2019-204763

SUMMARY

Technical Problem

However, the top-emission display device typically exhibits a large luminance variation with respect to a front luminance, when viewed from an oblique direction. Hence, a problem of the top-emission display device is that, in glowing white, the display device is white when viewed from the front. However, when the display is viewed from an oblique direction, the white appears to be tinged with a specific color.

The present disclosure is conceived in view of the above problem, and intended to provide a display device that can reduce, further than a known display device, luminance variation with respect to the front luminance when viewed from an oblique direction.

Solution to Problem

A display device according to an aspect of the present disclosure includes: a thin-film transistor layer including a plurality of thin-film transistors; a light-emitting element layer including light-emitting elements in a plurality of kinds each emitting a light in a different color; and a sealing layer that covers the light-emitting element layer. Each of the light emitting elements in the plurality of the kinds includes: a first electrode; a functional layer including a light-emitting layer, and a second electrode, all of which are provided on the thin-film transistor layer in a stated order from toward the thin-film transistor layer. The first electrode included in a light-emitting element in at least one kind among the light-emitting elements in the plurality of the kinds includes a plurality of reflective layers each including one reflective metal film and one transparent electrode film stacked on the reflective metal film. The plurality of the reflective layers are stacked so that the reflective metal film and the transparent electrode film are alternately arranged in a stated order from toward the thin-film transistor layer.

Advantageous Effects of Disclosure

An aspect of the present disclosure can provide a display device that can reduce, further than a known display device, luminance variation with respect to the front luminance when viewed from an oblique direction.

DESCRIPTION OF EMBODIMENTS

First Embodiment

Figure 2:
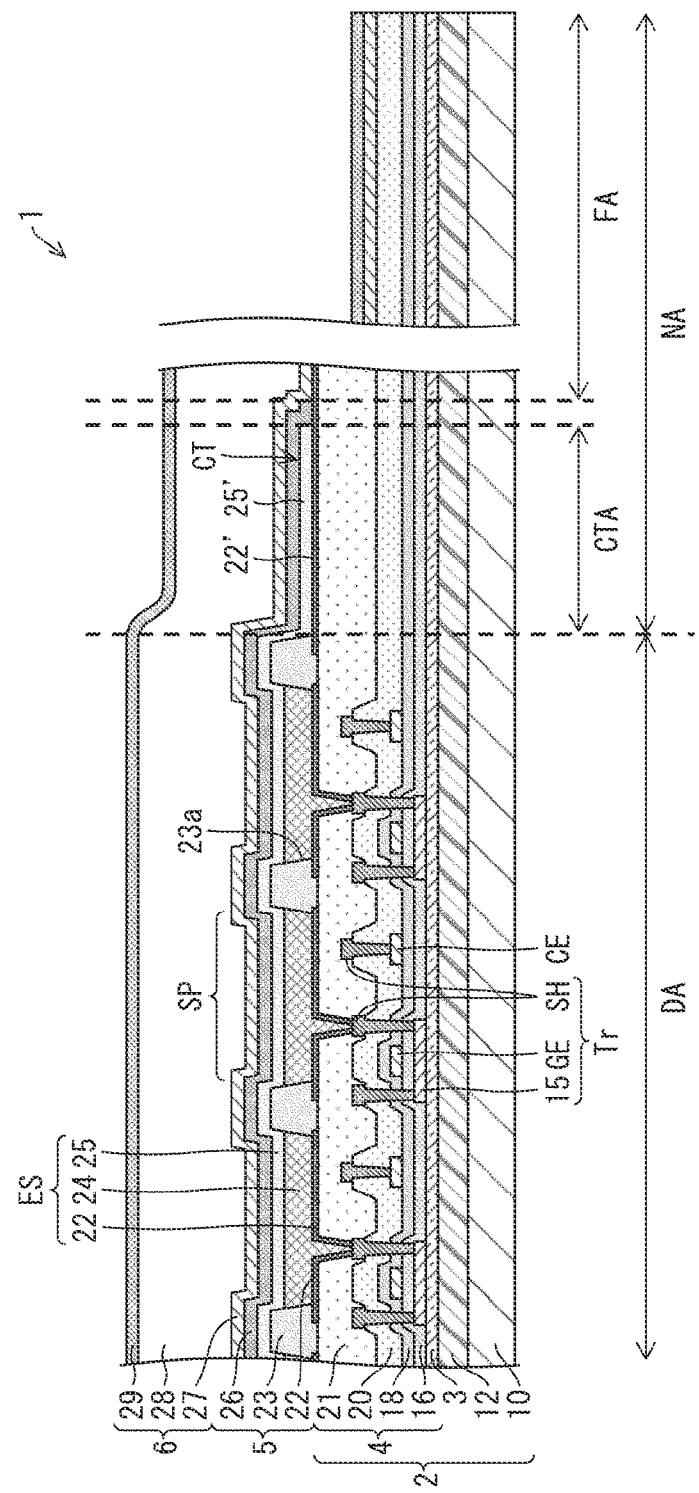
FIG. 2 is a cross-sectional view illustrating a schematic configuration of an essential part of the display device according to the first embodiment.

FIG. 2 is a cross-sectional view illustrating a schematic configuration of an essential part of a display device 1 according to this embodiment.

As illustrated in FIG. 2, the display device 1 according to this embodiment is a light-emitting display device. The display device 1 includes: an array substrate 2 in which a thin-film-transistor layer (hereinafter referred to as a "TFT layer") 4 is formed; and a light-emitting-element layer 5 provided on the array substrate 2.

The array substrate 2 illustrated in FIG. 2 includes a flexible substrate; namely, a base substrate (a support) including: a lower-face film 10; a resin layer 12; and a barrier layer 3 (a base coat film), all of which are stacked in the stated order from below. The TFT layer 4 is a drive element layer provided on the base substrate. Hence, the array substrate 2 includes, as an example, the lower-face film 10, the resin layer 12, the barrier layer 3, and the TFT layer 4 in the stated order from below.

The light-emitting-element layer 5 is provided on the TFT layer 4. The light-emitting-element layer 5 is covered with a sealing layer 6.

The light-emitting-element layer 5 includes a plurality of light-emitting elements ES. The TFT layer 4 includes a plurality of thin-film transistors Tr (TFTs) that drive these light-emitting elements ES. The configuration of the display device 1 will be described more specifically below.

The lower-face film 10 is a film attached to a lower face of the resin layer 12 after a support substrate such as a mother glass has been removed, in order to provide the display device 1 with excellent flexibility. An example of the lower-face film 10 includes a plastic film made of a flexible resin such as polyimide, or polycarbonate. Note that the lower-face film 10 and the resin layer 12 may be replaced with a solid substrate such as a glass substrate. An exemplary material of the resin layer 12 includes polyimide. The barrier layer 3 is a layer that keeps the TFT layer 4 and the light-emitting-element layer 5 from such foreign objects as water and oxygen. The barrier layer 3 can be formed of a silicon oxide film, a silicon nitride film, or a silicon oxide nitride film. Alternatively, the barrier layer 3 can be formed of a multilayer film including these films.

In the TFT layer 4, a sub-pixel circuit is formed to control each of the light-emitting elements ES in the light-emitting-element layer 5. The TFT layer 4 includes: a semiconductor film 15; an inorganic insulating film 16; a first metal layer including a gate electrode GE; an inorganic insulating film 18; a second metal layer including a capacitance line CE; an inorganic insulating film 20; a third metal layer including source and drain wires SH; and an interlayer insulating film 21 (a planarization film). These layers are provided in the stated order from below.

The display device 1 includes: a display region DA; and a frame region NA around the display region DA.

In a region included in the TFT layer 4 and corresponding to the display region DA, a plurality of thin-film transistors Tr are formed. Each of these thin-film transistors Tr includes: the semiconductor film 15; the inorganic insulating film 16; the gate electrode GE; the inorganic insulating film 18; the inorganic insulating film 20; and the source and drain wires SH.

In a region included in the TFT layer 4 and corresponding to the display region DA, a plurality of capacitive elements are formed. Each of these capacitive elements includes: a capacitive electrode (not shown) included in the capacitance line CE formed directly above the inorganic insulating film 18; the inorganic insulating film 18; and a capacitive counter electrode (not shown) formed to overlap the capacitive electrode. The capacitive counter electrode is formed directly below the inorganic insulating film 18 to overlap the capacitive electrode in the same layer as the first metal layer forming the gate electrode GE.

The semiconductor film 15 is formed of, for example, low-temperature polysilicon (LTPS) or oxide semiconductor (e.g. an In—Ga—Zn—O-based semiconductor). Note that, in FIG. 2, the thin-film transistor Tr is of a top-gate structure. Alternatively, the thin-film transistor Tr may be of a bottom-gate structure. Each of the first metal layer, the second metal layer, and the third metal layer is formed of a metal monolayer film containing, for example, at least one of such metals as aluminum, tungsten, molybdenum, tantalum, chromium, titanium, or copper. Alternatively, each metal layer is a multilayer metal film formed of these metals. Each of the inorganic insulating films 16, 18, and 19 can be, for example, a silicon oxide ($SiO_x$) film or a silicon nitride ($SiN_x$) film formed by the CVD. Alternatively, each of the inorganic insulating films 16, 18, and 19 can be a multilayer film including these films. The interlayer insulating film 21 can be formed of, for example, an applicable organic material such as polyimide, or acrylic.

The light-emitting-element layer 5 includes: a first electrode 22; a bank 23; a functional layer 24; a second electrode 25; and a cap layer 26, all of which are provided in the stated order from toward the TFT layer 4. One of the first electrode 22 and the second electrode 25 is an anode, and the other one is a cathode.

The light-emitting element ES includes: the first electrode 22; the functional layer 24; the second electrode 25; and the cap layer 26. In this embodiment, layers included in the light-emitting element ES and provided between the first electrode 22 and the second electrode 25 are collectively referred to as the functional layer 24. Note that the multilayer structure of the light-emitting element ES will be described later more specifically.

In the light-emitting-element layer 5, a region corresponding to the display region DA is provided with a plurality of the light-emitting elements ES. Each of the light-emitting elements ES is formed for a corresponding one of colored sub-pixels SP. The bank 23 functions as an edge cover covering each edge portion of the first electrode 22, and also as a sub-pixel separation film to separate the sub-pixels SP from each other. The bank 23 is provided with an opening portion 23a for each sub-pixel SP. Thorough this opening 23a, a portion of the first electrode 22 is exposed. This exposed portion is a light-emitting region of each sub-pixel SP. The bank 23 is made of, for example, a coating of such an insulative organic material as polyimide or acrylic. The coating is patterned by photolithography to form the bank 23.

Moreover, in the light-emitting-element 5, a routed portion 22' formed in the same layer as the first electrode 22 is formed across the display region DA and the frame region NA.

The second electrode 25 is formed on the whole surface of the display region DA. In the frame region NA, an extension portion 25' of the second electrode 25 is formed. The cap layer 26 is formed to cover the second electrode 25 and the extension portion 25' of the second electrode 25. The cap layer 26 covers the second electrode 25 formed on the whole surface of the display region DA, to cover the whole surface of the display region DA. The frame region NA includes: a contact region CTA in which the routed portion 22' and the extension portion 25' of the second electrode 25 form a contact portion CT; and a sealing region FA outside an end of the cap layer 26.

The sealing layer 6 is light-transparent, and includes, for example, a first inorganic sealing film 27, an organic sealing film 28, and a second inorganic sealing film 29, all of which are provided in the stated order from below (i.e. from toward the light-emitting-element layer 5). However, the sealing layer 6 shall not be limited to such a configuration. The sealing layer 6 may be formed of a single layer of an inorganic sealing film, or a multilayer stack including five or more layers of organic sealing films and inorganic sealing films. Because the light-emitting element ES is sealed with the sealing layer 6, the light-emitting element ES can be kept from water and oxygen.

Each of the first inorganic sealing film 27 and the second inorganic sealing film 29 can be formed of such a film as a silicon oxide film, a silicon nitride film, or a silicon oxide nitride film formed by the CVD. Alternatively, each of the first inorganic sealing film 27 and the second inorganic sealing film 29 can be formed of a multilayer film including these films. The organic sealing film 28 is a light-transparent organic film thicker than the first inorganic sealing film 27 and the second inorganic sealing film 29. For example, the organic sealing film 28 can be formed of an applicable photosensitive resin such as polyimide resin or acrylic resin.

Figure 1:
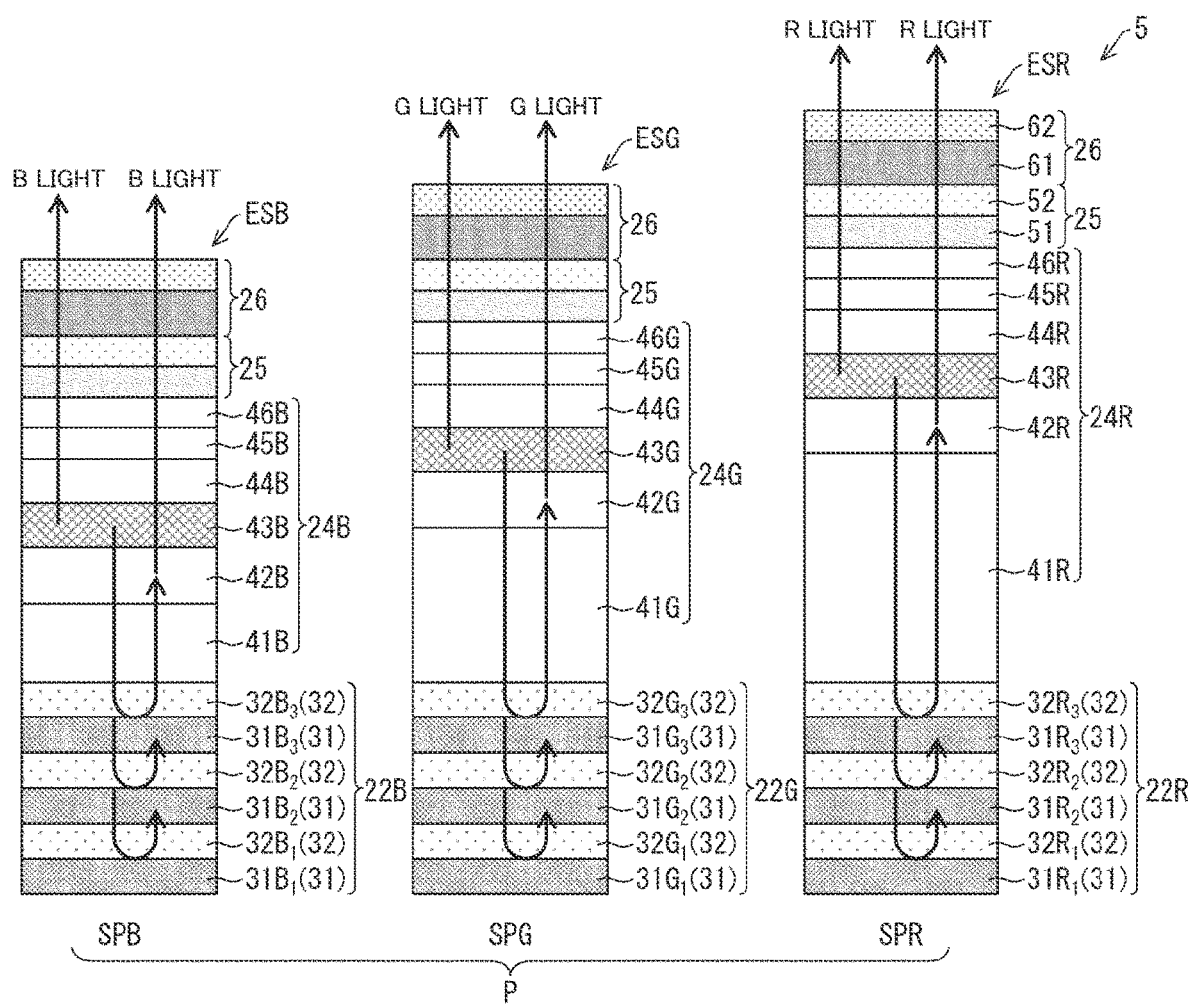
FIG. 1 is a drawing schematically illustrating an example of multilayer structures of colored light-emitting elements in a light-emitting-element layer of a display device according to a first embodiment.

Next, a multilayer structure of the light-emitting element ES is described more specifically, with reference to FIGS. 1 and 2.

As illustrated in FIG. 2, the light-emitting-element layer 5 has the layers of the light-emitting element ES stacked on top of one another. As described above, each bank 23 functions as a sub-pixel separation film separating the sub-pixels SP from each other. The first electrode 22 and at least a light-emitting layer of the functional layer 24 are separated by the bank 23. Hence, the display device 1 is provided with a plurality of the light-emitting elements ES corresponding to the respective sub-pixels SP. Note that the second electrode 25 and the cap layer 26 are not separated by the bank 23, but formed as a common layer in common among each of the sub-pixels SP.

An example below is a case where the first electrode 22 is a cathode and the second electrode is an anode. That is, the first electrode 22 is a patterned electrode (a patterned anode) patterned and formed into an island for each of the sub-pixels SP, and the second electrode 25 is a common electrode (a common cathode) provided in common among each of the sub-pixels SP.

The light-emitting element layer 5 includes a plurality of light-emitting elements ES emitting lights in different colors. FIG. 1 is a drawing schematically illustrating an example of multilayer structures of the colored light-emitting elements ES in the light-emitting-element layer 5 of the display device 1 according to this embodiment.

As illustrated in FIG. 1, the display device 1 includes, as the light-emitting elements ES, a light-emitting element ESR, a light-emitting element ESG, and a light-emitting element ESB. The light-emitting element ESR is a red light-emitting element emitting light in red (a red light, an R light). The light-emitting element ESG is a green light-emitting element emitting light in green (a green light, a G light). The light-emitting element ESB is a blue light-emitting element emitting light in blue (a blue light, a B light).

Note that, in this disclosure, the red light has a peak emission wavelength in a wavelength band of 580 nm and more, and less than 800 nm. Moreover, the green light has a peak emission wavelength in a wavelength band of 470 nm or more, and less than 580 nm. The blue light has a peak emission wavelength in a wavelength band of 380 nm or more, and less than 470 nm.

Furthermore, the display device 1 includes, as the sub-pixels SP, a sub-pixel SPR that is a red sub-pixel, a sub-pixel SPG that is a green sub-pixel, and a sub-pixel SPB that is a blue sub-pixel. Each of the sub-pixels SP is provided with one of a plurality of the light-emitting elements ES. Specifically, the sub-pixel SPR is provided with the light-emitting element ESR. The sub-pixel SPG is provided with the light-emitting element ESG. The sub-pixel SPB is provided with the light-emitting element ESB.

Hence, the first electrode 22 is separated by the banks 23 to correspond to the sub-pixel SPR, the sub-pixel SPG, and the sub-pixel SPB. The first electrode 22 is separated into islands. Hereinafter, each of the islands corresponding to one of the sub-pixel SPR, the sub-pixel SPG, and the sub-pixel SPB is respectively referred to as a first electrode 22R, a first electrode 22G, and a first electrode 22B. Hence, the light-emitting element ESR includes the first electrode 22R as the first electrode 22. The light-emitting element ESG includes the first electrode 22G as the first electrode 22. The light-emitting element ESB includes the first electrode 22B as the first electrode 22.

The display device 1 according to this embodiment is a top-emission display device including top-emission light-emitting elements; that is, the light is emitted from toward the upper faces of the light-emitting elements ES (i.e. the light is emitted across the TFT layer 4 from the light-emitting elements ES). Each of the first electrode 22R, the first electrode 22G, and the first electrode 22B includes a plurality of reflective layers (multiple layers) each including a reflective metal film and a transparent electrode film stacked on the reflective metal film. Hereinafter, the reflective metal film is referred to as an "RM", and the transparent electrode film as a "TE". Each of the reflective layers includes a pair of films; that is, one RM 31 and one TE 32. These reflective layers are stacked so that the RM 31 and the TE 32 are alternately arranged in the stated order from below (i.e. from toward the TFT layer 4). FIG. 1 shows an exemplary case where the first electrodes 22 in the respective light-emitting elements ES each include three of the reflective layers.

Hence, the first electrode 22R of the light-emitting element ESR in FIG. 1 includes, as the RMs 31 and the TEs 32, a first RM $31R_1$, a first TE $32R_1$, a second RM $31R_2$, a second TE $32R_2$, a third RM $31R_3$, and a third TM $32R_3$ in the stated order from below.

Moreover, the first electrode 22G of the light-emitting element ESG in FIG. 1 includes as the RMs 31 and the TEs 32, a first RM $31G_1$, a first TE $32G_1$, a second RM $31G_2$, a second TE $32G_2$, a third RM $31G_3$, and a third TM $32G_3$ in the stated order from below.

The first electrode 22B of the light-emitting element ESB in FIG. 1 includes as the RMs 31 and the TEs 32, a first RM $31B_1$, a first TE $32B_1$, a second RM $31B_2$, a second TE $32B_2$, a third RM $31B_3$, and a third TM $32B_3$ in the stated order from below.

The above RMs (e.g. the first RMs $31R_1$, $31G_1$, and $31B_1$, the second RMs $31R_2$, $31G_2$, and $31B_2$, and the third RMs $31R_3$, $31G_3$, and $31B_3$) are made of, for example, silver (Ag). Moreover, the above TEs (e.g. the first TEs $32R_1$, $32G_1$, and $32B_1$, the second TEs $32R_2$, $32G_2$, and $32B_2$, and the third TEs $32R_3$, $32G_3$, and $32B_3$) are made of, for example indium tin oxide (ITO).

Note that the above RMs shall not be limited to films made of Ag (Ag films). For example, the RMs may be aluminum (Al) films made of Al.

Moreover, the TEs shall not be limited to ITO films made of ITO. For example, the TEs may be indium zinc oxide (IZO) films made of IZO. Hence, a material of the first electrode 22 as the anode is preferably an electrode material having a work function of, for example, 4.5 or higher, so that holes can be efficiently injected into the functional layer 24. Moreover, the above TEs function as optical path length adjustment layers that adjust optical path lengths between the RMs and the light-emitting layer. Hence, desirably, the TEs are made of a material to minimize decreases in luminance of light from the light-emitting layer and in emission characteristics of the light-emitting layer. Hence, preferably, the TEs are made of, for example, either ITO or IZO: that is, a transparent electrode material having a high work function (or a high ionization potential energy). Note that the above TEs may be either amorphous TEs or crystalline TEs.

The functional layer 24 is, as described above, a layer between the first electrode 22 and the second electrode 25 in the light-emitting element ES. The functional layer 24 includes at least a light-emitting layer. If the light-emitting element ES is a so-called organic light-emitting diode (OLED) that is referred to as an organic electroluminescence (EL) element, the functional layer 24 is made of an organic layer referred to as an organic EL layer. Note that the functional layer 24 may be a single layer made only of a light-emitting layer, or may be a multilayer including a functional layer other than the light-emitting layer. Moreover, the light-emitting element ES shall not be limited to the OLED. For example, the light-emitting element ES may be a quantum-dot light-emitting diode (QLED).

Of the functional layer 24, a functional layer other than the light-emitting layer includes, for example, a hole-injection layer, a hole-transport layer, a hole-blocking layer, an electron-transport layer, and an electron-injection layer. Hereinafter, the hole-injection layer is referred to as an "HIL". The hole-transport layer is referred to as an "HTL". The hole-blocking layer is referred to as an "HBL". The electron-transport layer is referred to as an "ETL". The electron-injection layer is referred to as an "EIL". Moreover, the light-emitting layer is referred to as an "EML".

The HIL is a layer to transport the holes from the anode to the HTL. The HTL is a layer to transport the holes from the HIL to the EML. The HIL and the HTL may each be formed as independent layers, or may be formed integrally as an HI-HT layer.

The HIL and the HTL are made of a known hole-transporting material. Examples of the hole-transporting material include: 4,4'-bis(N-carbazolyl)-1,1'-biphenyl (CBP); N,N'-di(naphthalen-1-yl)-N,N'-diphenylbenzidine (α-NPD); 2,3,6,7,10,11-hexacyano-1,4,5,8,9,12-hexaazatriphenylene (HAT-CN). (4,4'-Bis(2,2'-diphenyl vinyl)-biphenyl) (BczVBi), molybdenum trioxide ($MoO_3$), chromium oxide ($Cr_2O_3$), and nickel oxide (NiO). One kind of these hole-transporting materials alone may be used. Alternatively, two or more kinds of these hole-transporting materials may be mixed appropriately and used. Moreover, the above hole-transporting materials may be intrinsic hole-transporting materials not doped with impurities. Alternatively, the hole-transporting materials may be doped with impurities in order to have higher conductivity.

If the light-emitting element ES is, for example, an OLED, the EML is formed of a light-emitting material made of an organic material. The organic light-emitting material may be either a phosphorescent light-emitting material, or a fluorescent light-emitting material. Moreover, the EML may be formed of a two-component system containing a host material to transport the holes and the electrons and a light-emitting dopant material as a light-emitting material to emit light. Alternatively, the EML may also be formed of a light-emitting material alone.

Examples of a red organic light-emitting material to be used for the light-emitting element ESR include tris (1-phenylisoquinoline)iridium (III) (Ir(piq)3), and tetraphenyldibenzoperiflanthene (DBP).

Examples of a green organic light-emitting material to be used for the light-emitting element ESG include ortho-metalized iridium complex (Ir(ppy)3), and 3-(2-benzothiazolyl)-7-(diethylamino)coumarin (Coumarin 6).

Examples of a blue organic light-emitting material to be used for the light-emitting element ESB include 4,4'-bis(9-ethyl-3-carbazovinylene)-1,1'-biphenyl (BczVBi), and 2,5,8,11-tetra-tert-butylperylene (TBPe).

If the light-emitting element ES is, for example, a QLED, the EML may contain, as a light-emitting material, nano-sized quantum dots (semiconductor nanoparticles). The above quantum dots may be known quantum dots. The above quantum dots may contain at least one kind of a semiconductor material formed of at least one kind of element selected from a group consisting of, for example: cadmium (Cd); sulfur (S); tellurium (Te); selenium (Se); zinc (Zn); indium (In); nitrogen (N); phosphorus (P); arsenic (As); antimony (Sb); aluminum (Al); gallium (Ga); lead (Pb); silicon (Si); germanium (Ge); and magnesium (Mg).

The HIL is a layer to transport the electrons from the cathode to the ETL. The ETL is a layer to transport the electrons from the EIL to the EML. The EIL and the ETL may each be formed as independent layers, or may be formed integrally as an EI-ET layer.

Moreover, the HBL is a layer to keep the holes from flowing and block the holes not to flow into the ETL.

These EIL, ETL, and HBL are formed of a known electron-transporting material. Examples of the electron-transporting material include: bis(10-hydroxybenzo[h]quinolinato)beryllium(II) (BeBq2); 4,7-diphenyl-1,10-phenanthroline (Bphen); and 2,9-dimethyl-4,7-diphenyl-1,10-phenanthroline (BCP); and lithium fluoride (LiF). One kind of these hole-transporting materials alone may be used. Alternatively, two or more kinds of these hole-transporting materials may be mixed appropriately and used.

As illustrated in FIG. 1, the functional layer 24 of the light-emitting element ESR includes, for example, an HIL 41R, an HTL 42R, an EML 43R, an HBL 44R, an ETL 45R, and an EIL 46R stacked in the stated order from toward the first electrode 22. The functional layer 24 of the light-emitting element ESG includes, for example, an HIL 41G, an HTL 42G, an EML 43G, an HBL, an ETL 45G, and an EIL 46G stacked in the stated order from toward the first electrode 22. The functional layer 24 of the light-emitting element ESB includes, for example, an HIL 41B, an HTL 42B, an EML 43B, an HBL 44B, an ETL 45B, and an EIL 46B stacked in the stated order from toward the first electrode 22.

Note that the above stacking orders are examples when the first electrode 22 is the anode and the second electrode 25 is the cathode. When the first electrode 22 is the cathode and the second electrode 25 is the anode, the layers are stacked in the reverse orders. Moreover, the configuration of the functional layer 24 shall not be limited to the above exemplary layer configuration, and may have a desired layer configuration in accordance with desired characteristics of the light-emitting element ES.

If the functional layer 24 is colored in different colors and vapor-deposited so that the light-emitting elements ES emit lights in different colors for the respective sub-pixels SP, at least EMLs 43R, 43G, and 43B of the functional layer 24 are each formed for the respective regions surrounded by the banks 23 (i.e. for a corresponding one of the sub-pixels SP). Note that the functional layers other than the EMLs 43R, 43G, and 43B may be either separated by the banks 23, or formed as common layers.

Including the extension portion 25', the second electrode 25, which is an electrode provided where light is released, is either a transparent electrode, or a translucent electrode. The second electrode 25 may be, for example, either a translucent electrode 51 alone made of a translucent metal thin-film, or, as illustrated in FIG. 1, a combination of the translucent electrode 51 made of a translucent metal thin-film and a transparent electrode 52. For example, if the translucent electrode 51 is of high resistance and poor uniformity in luminance of emitted light, the transparent electrode 52 as an auxiliary electrode layer is stacked on the translucent electrode 51.

As described above, if the second electrode 25 is a cathode, the second electrode 25 (in particular, the translucent electrode 51) is desirably made of an electrode material having a work function of, for example, 4.5 or higher, so that electrons can be efficiently injected into the functional layer 24.

The above translucent electrode 51 (a metal thin-film) is made of, for example, such a metal as: aluminum (Al); silver (Ag); gold (Au); magnesium (Mg); calcium (Ca); lithium; (Li), or chrome (Cr). Alternatively, the translucent electrode 51 may be an alloy thin-film containing these metals. The transparent electrode 52 is made of, for example, ITO, or IZO.

The second 25 including the translucent electrode 51 and the transparent electrode 52 is formed as a common layer in common among each of the sub-pixels SP.

Moreover, as described before, the cap layer 26 is provided as a common layer to cover the whole surface of the display region DA. The cap layer 26 functions as an optical adjustment layer to adjust light emitted from the light-emitting element ES, and also as a protective layer to protect the second electrode 25. The cap layer 26 is made of a material that minimizes decreases in luminance of the light from the light-emitting element ES, and in emission characteristics of the light-emitting element ES. The cap layer 26 may be formed of either an organic cap layer 61 alone, or an inorganic cap layer 62 alone. Alternatively, as illustrated in FIG. 1, the cap layer 26 may be formed of a multilayer stack including the organic cap layer 61 and the inorganic cap layer 62.

If the cap layer 26 is formed of the organic cap layer 61 alone, the cap layer 26 may be formed of a layer containing aromatic hydrocarbon. Note that the aromatic hydrocarbon may be, for example, α-NPD. Meanwhile, if the cap layer 26 is formed of the inorganic cap layer 62 alone, the cap layer 26 may be formed of a LiF layer. If the cap layer 26 is formed of the multilayer stack including the organic cap layer 61 and the inorganic cap layer 62, the cap layer 61 may be a layer containing aromatic hydrocarbon and the inorganic cap layer 62 may be a LiF layer.

Moreover, as seen in this embodiment, if the cap layer 26 is formed of the multilayer stack including the organic cap layer 61 and the inorganic cap layer 62, a refractive index in a visible light region of the organic cap layer 61 is preferably higher than a refractive index in a visible light region of the inorganic cap layer 62. Specifically, the refractive index in the visible light region of the organic cap layer 61 is 1.8 or higher and 2.1 or lower. The refractive index in the visible light region of the inorganic cap layer 62 is preferably 1.2 or higher and 1.3 or lower.

As can be seen, the ESR illustrated in FIG. 1 includes, for example, the first RM $31R_1$, the first TE $32R_1$, the second RM $31R_2$, the second TM $32R_2$, the third RM $31R_3$, the third TM $32R_3$, the HIL 41R, the HTL 42R, the EML 43R, the HBL 4R, the ETL 45R, the EIL 46R, the translucent electrode 51, the transparent electrode 52, the organic cap layer 61, and the inorganic cap layer 62 in the stated order from below.

Moreover, the light-emitting element ESG illustrated in FIG. 1 includes, for example, the first RM $31G_1$, the first TE $32G_1$, the second RM $31G_2$, the third RM $31G_3$, the third TM $32G_3$, the HIL 41G, the HTL 42G, the EML 43G, the HBL 4G, the ETL 45G, the EIL 46G, the translucent electrode 51, the transparent electrode 52, the organic cap layer 61, and the inorganic cap layer 62 in the stated order from below.

The light-emitting element ESB illustrated in FIG. 1 includes, for example, the first RM $31B_1$, the first TE $32B_1$, the second RM $31B_2$, the second TM $32B_2$, the third RM $31B_3$, the third TM $32B_3$, the HIL 41B, the HTL 42B, the EML 43B, the HBL 4B, the ETL 45B, the EIL 46B, the translucent electrode 51, the transparent electrode 52, the organic cap layer 61, and the inorganic cap layer 62 in the stated order from below.

Next, thicknesses of the layers in each of the light-emitting elements ES are described.

As described above, the first electrode 22 includes a plurality of the reflective layers each including the RM 31 and the TE 32.

In this embodiment, multiple reflection by the RMs 31 relaxes conditions of optical interference. Details of such a feature will be described later. Specifically, in this embodiment, RMs 31 of reflective layers other than the lowermost reflective layer, in particular, the RM 31 of the uppermost reflective layer, reflect light and allow the light to pass through, in order to multiple reflect the light. Hence, the reflective layers RMs 31 of the reflective layers other than the lowermost reflective layer, in particular, the RM 31 of the uppermost reflective layer, desirably function as semi-transmissive reflective metal films (half mirrors) that reflect the light and allow the light to pass through. Meanwhile, the RM 31 of the lowermost reflective layer is desirably high in reflectance in order to increase use efficiency of the light emitted from the EML of the functional layer 24. The RMs 31 of the reflective layers other than the lowermost reflective layer, in particular, the RM 31 of the uppermost reflective layer, are desirably lower in reflectance and higher in transmittance than the RM 31 of the lowermost reflective layer.

Hence, the RMs 31 of the reflective layers other than the lowermost reflective layer, in particular, the RM 31 of the uppermost reflective layer, are desirably thinner than the RM 31 of the lowermost reflective layer. Thus, in the example shown in FIG. 1, in the light-emitting element ESR, the third RM $31R_3$ is desirably thinner than the first RM $31R_1$. In the light-emitting element ESG, the third RM $31G_3$ is desirably thinner than the first RM $31G_1$. In the light-emitting element ESB, the third RM $31B_3$ is desirably thinner than the first RM $31B_1$.

Moreover, among the plurality of the reflective layers, the TE 32 of the uppermost reflective layer functions as a main optical path length adjustment layer that adjusts an optical path length in which a wavelength of a main emission peak resonates in an emission wavelength band of each of the light-emitting elements ES. The main emission peak will be described later. Hence, the TE 32 of the uppermost reflective layer desirably minimizes decreases in luminance of light from the EML and in emission characteristics of the EML. Moreover, as described above, the TE 32 functions as an optical path length adjustment layer, however, the TE 32 is more likely to serve as a protection of the RMs 31 below the TE 32. Hence, as to the TE 32 of the uppermost reflective layer, the thinner the better. For example, the TE 32 is desirably thinner than the RM 31 directly below the TE 32. Hence, in the example illustrated in FIG. 1, in the light-emitting element ESR, the third TE 32R$_3$ is desirably thinner than the third RM 31R$_3$. In the light-emitting element ESG, the third TE 32G$_3$ is desirably thinner than the third RM 31G$_3$. In the light-emitting element ESB, the third TE 32B$_3$ is desirably thinner than the third RM 31B$_3$.

Furthermore, in order to proactively utilize multiple interference from below, a layer above is desirably thinner than a layer below. Hence, in order to utilize the multiple interference from below, for example, among the plurality of the reflective layers, the RM 31 of the uppermost reflective layer is desirably thinner than the TE 32 of the lowermost reflective layer. Hence, in the example illustrated in FIG. 1, in the light-emitting element ESR, the third RM 31R$_3$ is desirably thinner than the first TE 32R$_1$. In the light-emitting element ESG, the third RM 31G$_3$ is desirably thinner than the first TE 32G$_1$. In the light-emitting element ESB, the third RM 31B$_3$ is desirably thinner than the first TE 32B$_1$.

Specifically, among the plurality of the reflective layers, the RM 31 of the lowermost reflective layer has a thickness desirably ranging 80 nm or more and 120 nm or less, regardless of the kind of the light-emitting element ES. If the thickness of the RM 31 is 80 nm or more, the RM 31 can maintain a high surface reflectance. Meanwhile, if the thickness of the RM 31 is 120 nm or less, the RM 31 can be formed and the display device 1 can be manufactured without compromising the throughput. Moreover, in view of production efficiency, the RM 31 has a thickness desirably ranging 80 nm or more and 120 nm or less, regardless of the kind of the light-emitting element ES.

Moreover, among the plurality of the reflective layers, the RMs 31 of the reflective layers other than the lowermost reflective layer have a thickness ranging 10 nm or more and 60 nm or less, regardless of the kind of the light-emitting element ES. If the thickness of the RMs 31 is 10 nm or more, the transmittance of the RMs 31 can be reduced such that the RMs 31 can function as half mirrors. Meanwhile, if the thickness of the RMs 31 is 60 nm or less, the reflectance of the RMs 31 can be reduced such that the RMs 31 can function as half mirrors. As a result, the light emitted from the EML can be multiple reflected, making it possible to obtain a secondary interference peak, which is not produced in a single reflective layer, as a sub emission peak smaller than the main emission peak.

Moreover, the more the thickness of the RMs 31 is within the above range, the smaller the luminance angle dependency is. In other words, the more the thickness of the RMs 31 is within the above range, the less the width in the luminance variation with respect to the front luminance is when viewed from an oblique direction. Thus, the less the thickness of the RMs 31 is within the range, the less the influence of the thickness is on the luminance angle dependency. Hence, the RMs 31 desirably have a thickness ranging 10 nm or more and 60 nm or less, regardless of the kind of the light-emitting element ES.

Moreover, as described before, among the plurality of the reflective layers, the TE 32 of the uppermost reflective layer functions as the main optical path length adjustment layer, and desirably minimizes decreases in luminance of the light from the EML and in emission characteristics of the EML. Furthermore, as described before, the TE 32 is more likely to serve as a protection of the RMs 31 below the TE 32. Hence, the TE 32 of the uppermost reflective layer has a thickness desirably ranging 10 nm or more and 100 nm or less, regardless of the kind of the light-emitting element ES. If the thickness of the TE 32 is 10 nm or more, the TE 32 can function as a protective film to protect the RMs 31 below the TE 32. Meanwhile, if the TE 32 is 100 nm or less, the thickness distribution of the surface of the TE 32 can be reduced. Moreover, if the TE 32 has a large thickness, the thickness distribution is likely to occur. In view of process control, the TE 32 has a thickness desirably ranging 10 nm or more and 100 nm or less, regardless of the kind of the light-emitting element ES.

Moreover, among the plurality of the reflective layers, the thickness of a TE 32 of a reflective layer other than the uppermost reflective layer functions as an optical path length adjustment layer that adjusts an optical path length of the optical interference between the RM 31 disposed directly below the TE 32 and the RM 31 disposed directly above TE 32 and functioning as a half mirror. In adjusting the thickness of the TE 32, the position of the sub emission peak can be adjusted.

Hence, the thickness of the TE 32 of a reflective layer other than the uppermost reflective layer is appropriately adjusted to have the sub emission peak in a wavelength band of a color of the light emitted from each of the light-emitting elements ES. For example, in the light-emitting element ESR, the thickness of the TE 32 of a reflective layer other than the uppermost reflective layer is appropriately adjusted to have a sub emission peak in a wavelength band of the red light described before. In the light-emitting element ESG, the thickness of the TE 32 of a reflective layer other than the uppermost reflective layer is appropriately adjusted to have a sub emission peak in a wavelength band of the green light described before. In the light-emitting element ESB, the thickness of the TE 32 of a reflective layer other than the uppermost reflective layer is appropriately adjusted to have a sub emission peak in a wavelength band of the blue light described before.

As can be seen, the thickness of the TE 32 of a reflective layer other than the uppermost reflective layer may be appropriately adjusted to have a sub emission peak in a wavelength band of a color of the light emitted from each of the light-emitting elements ES. The thickness shall not be limited to a particular thickness. However, the TE 32 of a reflective layer other than the uppermost reflective layer has a thickness desirably ranging 10 nm or more and 100 nm or less, regardless of the kind of the light-emitting element ES. If the thickness of the TE 32 is 10 nm or more, the TE 32 can function as a protective film to protect the RM 31 below the TE 32. Meanwhile, if the TE 32 has a large thickness, the thickness distribution is likely to occur. If the thickness of the TE 32 is 100 nm or less, process control of the thickness distribution can be easily performed. Moreover, in order to ensure the function of protecting the RM 31 below and to ensure the process controllability, the TE 32 has a thickness desirably ranging 10 nm or more and 100 nm or less, regardless of the kind of the light-emitting element ES.

Moreover, if the second electrode 25 is the translucent electrode 51 made of a metal thin film, the translucent electrode 51 has a thickness of preferably, for example, 10 nm or more and 40 nm or less. If the thickness of the translucent electrode 51 is 10 nm or more, the translucent electrode 51 can cover the surface of the functional layer 24 without being broken into steps, and function as an electrode. Moreover, if the thickness of the translucent electrode 51 is 40 nm or less, the translucent electrode 51 does not significantly reduce transmittance of light, and can prevent decreases in luminance and emission efficiency. Furthermore, if the transparent electrode 52 is provided on the translucent electrode 51, the transparent electrode 52 has a thickness ranging, for example, 10 nm or more and 30 nm or less. If the thickness of the transparent electrode 52 is, for example, 10 nm or more, the transparent electrode 52 can prevent a rise of a drive voltage generated as wiring resistance increases. Moreover, if the thickness of the transparent electrode 52 is, for example, 30 nm or less, the transparent electrode 52 can prevent a decrease in luminance without reducing transmittance of light.

If the cap layer 26 is formed of the organic cap layer 61 alone, the cap layer 26 has a thickness of desirably ranging, for example, 10 nm or more and 100 nm or less. Moreover, if the cap layer 26 is formed of the inorganic cap layer 62 alone, the cap layer 26 has a thickness of desirably ranging, for example, 10 nm or more and 50 nm or less. Furthermore, if the cap layer 26 is formed of a multilayer stack including the organic cap layer 61 and the inorganic cap layer 62, the organic layer 61 is desirably thicker than the inorganic cap layer 62. In such a case, the organic cap layer 61 has a thickness ranging desirably 20 nm or more and 100 nm or less, and the inorganic cap layer 62 has a thickness ranging desirably 10 nm or more and 50 nm or less. Such a feature makes it possible to create the optical interference effect and improve the release of light.

Note that the thickness of the functional layer 24 (i.e. a distance between the first electrode 22 and the second electrode 25) shall not be limited to a particular thickness. The thickness of the functional layer 24 is set within a range of, for example, 1 to 1000 nm. The thickness is more preferably set within a range of 50 to 200 nm. If the thickness of the functional layer 24 is, for example, 50 nm or more, a pixel defect caused by such a foreign object as dust can be prevented, making it possible to reduce a decrease in emission efficiency caused by evanescent light. Moreover, if the thickness of the functional layer 24 is 200 nm or less, a rise of a drive voltage caused by a resistive component of the functional layer 24 can be reduced. Note that the thickness of each layer in the functional layer 24 may be appropriately set so that a requested characteristic of the light-emitting element ES is obtained, depending on the kind of the layer. Hence, the thickness shall not be limited to a particular thickness. If the color purity is improved by the interference effect (the microcavity effect), the thickness of each layer may be adjusted to an optimum thickness for a respective color of an emitted light so that a desired optical path length is obtained.

Specifically, the thickness of the functional layer 24 may be set, depending on the thickness of the TE 32 of the uppermost reflective layer so that a distance between the RM 31 of the uppermost reflective layer in the first electrode 22 and the second electrode 25 is an optical path length in which a wavelength of a color of the light emitted from each of the light-emitting elements ES resonates. For example, in the light-emitting element ESR, the thickness of the functional layer 24R may be set, depending on the thickness of the TE 32 of the uppermost reflective layer so that a distance between the RM 31 of the uppermost reflective layer in the first electrode 22R and the second electrode 25 is an optical path length in which a wavelength of the red light resonates. In the light-emitting element ESG, the thickness of the functional layer 24G may be set depending on the thickness of the TE 32 of the uppermost reflective layer, so that a distance between the RM 31 of the uppermost reflective layer in the first electrode 22G and the second electrode 25 is an optical path length in which a wavelength of the green light resonates. In the light-emitting element ESB, the thickness of the functional layer 24B may be set depending on the thickness of the TE 32 of the uppermost reflective layer, so that a distance between the RM 31 of the uppermost reflective layer in the first electrode 22B and the second electrode 25 is an optical path length in which a wavelength of the blue light resonates.

Next, effects of the multilayer first electrode 22 are specifically described with reference to FIGS. 3 to 11.

As described before, the display device 1 according to this embodiment includes, as sub-pixels, the sub-pixel SPR, the sub-pixel SPG, and the sub-pixel SPB. One pixel P includes these three sub-pixels SPR, SPG, and SPB. The above display device 1 simultaneously turns on the light-emitting elements ESR, ESG, and ESB in the respective sub-pixels SPR, SPG, and SPB so that the light can glow white (i.e. a white light can be displayed).

As described before, a known top-emission display devise typically exhibits a large luminance variation (specifically, a large decrease in luminance) when viewed from an oblique direction. Hence, as described above, in glowing white, the known display device is white when viewed from the front. However, when viewed from an oblique direction, the white appears to be tinged with a specific color. Such a tinge of the white glow in an oblique direction (an optical variation in an oblique direction) is created by optical interference of a light passing downwards and a light reflecting upwards between the first electrode and the second electrode, and by increasing directivity of the light emitted from the EML.

As described above, the first electrode 22 is multilayered so that the RMs 31 and the TEs 32 are alternately stacked. Of the lights emitted from the EML in the functional layer 24, the light emitted toward the second electrode 25 passes through the second electrode 25, and is emitted outside. Meanwhile, the light emitted from the above EML toward the first electrode 22 is reflected on, for example, the RM 31 of the uppermost reflective layer in the first electrode 22 (specifically, the third RMs $31R_3$, $31G_3$, and $31B_3$), passes through the functional layer 24 and the second electrode 25, and is emitted outside. Here, as illustrated in FIG. 1, the light not reflected on the RM 31 of the uppermost reflective layer and passing through the RM 31 is reflected on the RM 31 of a reflective layer below the RM 31 of the uppermost reflective layer, passes through the functional layer 24 and the second electrode 25, and is emitted outside. Hence, in the display device 1 according to this embodiment, the lights repeat reflecting, depending on the number of the layers in the reflective layers, causing multiple interference such as the primary interference, the secondary interference, and the tertiary interference.

Figure 3:
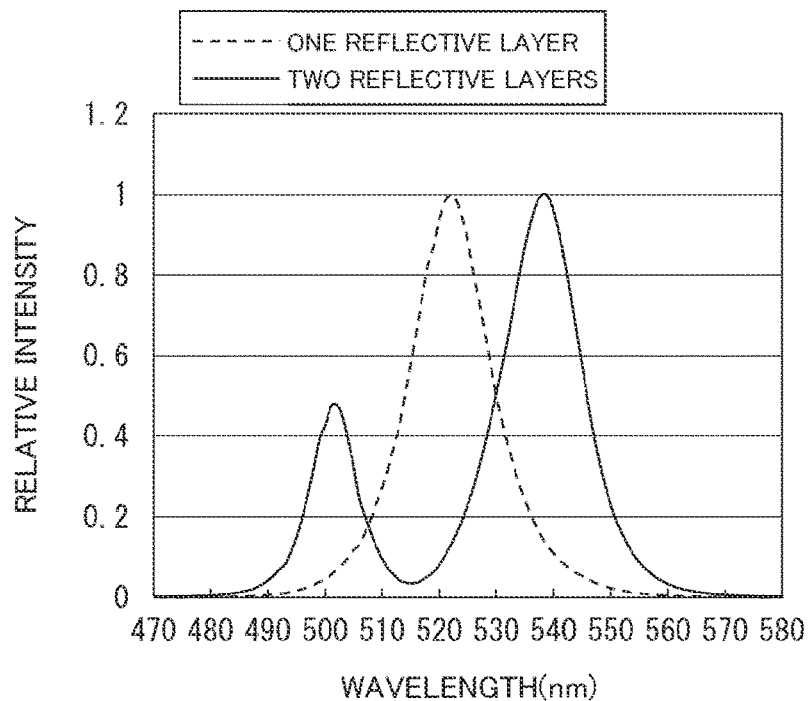
FIG. 3 is a graph collectively illustrating an emission spectrum of a light-emitting element cited in Table 1 and formed on a substrate as a support, and an emission spectrum of a light-emitting element cited in Table 2 and formed on a substrate as a support.
Figure 4:
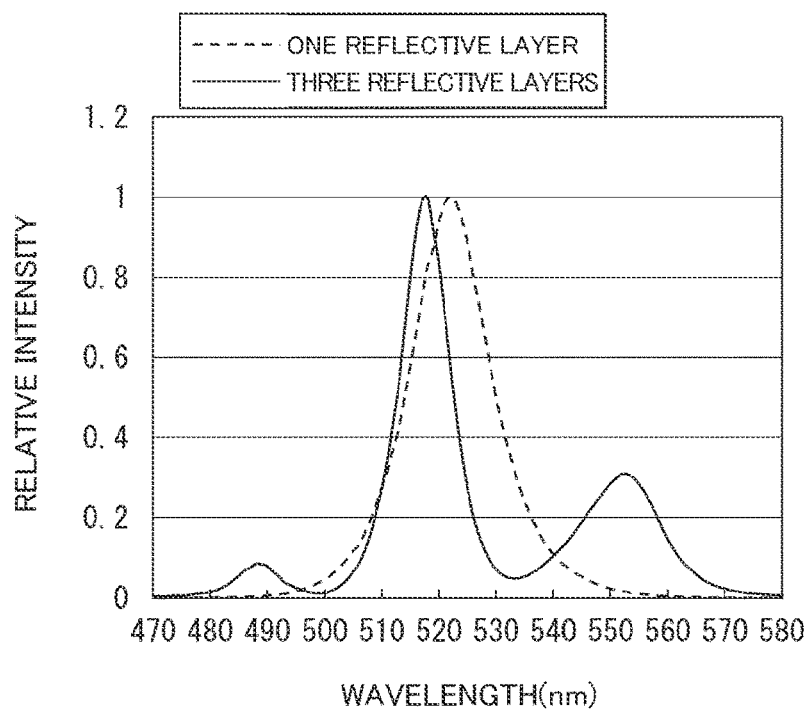
FIG. 4 is a graph collectively illustrating the emission spectrum of the light-emitting element cited in Table 1 and formed on the substrate as a support, and an emission spectrum of a light-emitting element cited in Table 3 and formed on a substrate as a support.

FIG. 3 is a graph collectively illustrating an emission spectrum of a light-emitting element ESG cited in Table 1, formed on a substrate as a support, and including one reflective layer alone, and an emission spectrum of a light-emitting element ESG cited in Table 2, formed on a substrate as a support, and including two reflective layers. FIG. 4 is a graph collectively illustrating the emission spectrum of the light-emitting element ESG cited in Table 1, formed on the substrate as a support, and including one reflective layer alone, and an emission spectrum of a light-emitting element ESG cited in Table 3, formed on a substrate as a support, and including three reflective layers. Note that, in FIGS. 3 and 4, the relative intensity is an emission intensity of each of the light-emitting elements ESG at the front where an emission intensity of the main emission peak of each of the light-emitting elements ESG is 1 when each of the light-emitting elements ESG cited in Tables 1 to 3 is viewed from the front.

TABLE 1

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46G | 0.5 | 1.39 | 0.0 |
| ETL 45G | 15 | 1.86 | 0.0 |
| HBL 4G | 40 | 1.77 | 0.0 |
| EML 43G | 20 | 1.75 | 0.0 |
| HTL 42G | 10 | 1.78 | 0.0 |
| HIL 41G | 145 | 1.75 | 0.0 |
| First TE $32G_1$ | 19 | 2.15 | 0.0 |
| First RM $31G_1$ | 80 | 0.09 | 3.1 |
| Substrate | $7.00 \times 10^5$ | 1.52 | 0.0 |

TABLE 2

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46G | 0.5 | 1.39 | 0.0 |
| ETL 45G | 15 | 1.86 | 0.0 |
| HBL 4G | 40 | 1.77 | 0.0 |
| EML 43G | 20 | 1.81 | 0.0 |
| HTL 42G | 10 | 1.78 | 0.0 |
| HIL 41G | 140 | 1.75 | 0.0 |
| Second TE $32G_2$ | 20 | 2.15 | 0.0 |
| Second RM $31G_2$ | 40 | 0.09 | 3.1 |
| First TE $32G_1$ | 80 | 2.15 | 0.0 |
| First RM $31G_1$ | 80 | 0.09 | 3.1 |
| Substrate | $7.00 \times 10^5$ | 1.52 | 0.0 |

TABLE 3

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46G | 0.5 | 1.39 | 0.0 |
| ETL 45G | 15 | 1.86 | 0.0 |
| HBL 4G | 40 | 1.77 | 0.0 |
| EML 43G | 20 | 1.81 | 0.0 |
| HTL 42G | 10 | 1.78 | 0.0 |
| HIL 41G | 140 | 1.75 | 0.0 |
| Third TE $32G_3$ | 19 | 2.15 | 0.0 |
| Third RM $31G_3$ | 30 | 0.09 | 3.1 |
| Second TE $32G_2$ | 80 | 2.15 | 0.0 |
| Second RM $31G_2$ | 50 | 0.09 | 3.1 |
| First TE $32G_1$ | 80 | 2.15 | 0.0 |
| First RM $31G_1$ | 80 | 0.09 | 3.1 |
| Substrate | $7.00 \times 10^5$ | 1.52 | 0.0 |

Note that, in Tables 1 to 3, the first RM $31G_1$, the second RM $31G_2$, and the third RM $31G_3$ are Ag films. Moreover, the first TE $32G_1$, the second TM $32G_2$, and the third TM $32G_3$ are ITO films. The HIL 41G is a hole-injection layer made of an organic material. The HTL 42G is a hole-transport layer made of an organic material. The EML 43G is a light-emitting layer made of an organic material containing a dopant. The HBL 4G is a hole-blocking layer made of an organic material. The ETL 45G is an electron-transport layer made of an organic material. The EIL 46G is an electron-injection layer having a low work function. The translucent electrode 51 is an electrode made of an alloy material containing a metallic material (e.g. Mg) having a low work function. The transparent electrode 52 is a semi-metallic electrode such as Ag. The organic cap layer 61 is a capping layer made of an organic material and having a large refractive index. The inorganic cap layer 62 is a capping layer made of LiF and having a low refractive index.

According to this embodiment, as described above, the first electrode 22 is multilayered, and the light emitted from the EML is multiple reflected. Hence, as illustrated in FIGS. 3 and 4, such features make it possible to obtain a secondary interference peak, which is not produced in a single reflective layer, as a sub emission peak. Here, as illustrated in FIG. 3, when two reflective layers are provided, two emission peaks in total are observed; that is, one main emission peak and one sub emission peak. Moreover, as illustrated in FIG. 4, when three reflective layers are provided, three emission peaks in total are observed; that is, one main emission peak and two sub emission peaks. Hence, when the first electrode 22 is multilayered, the number of emission peaks increases in proportion to the number of the reflective layers.

Figure 5:
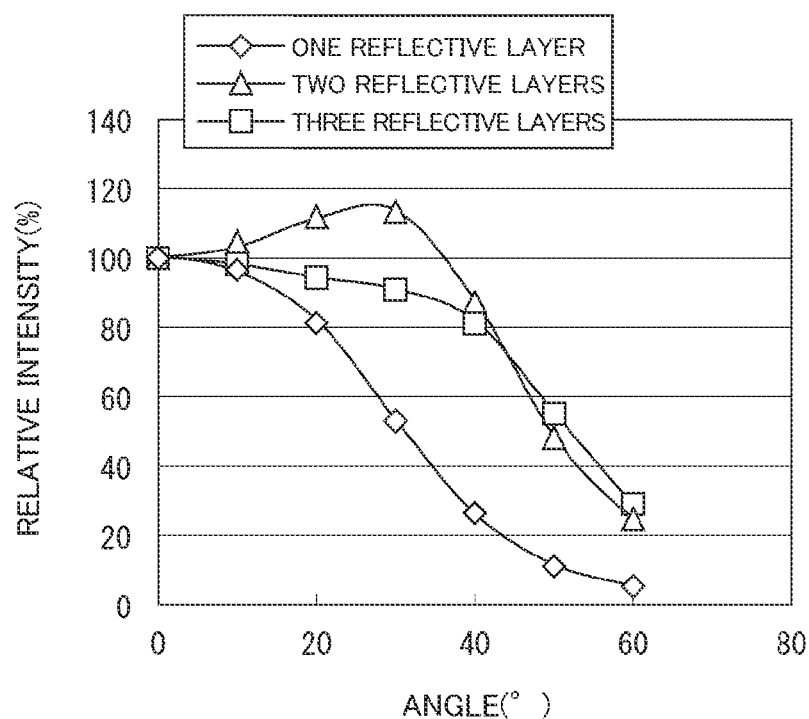
FIG. 5 is a graph illustrating a relationship between the number of reflective layers of a first electrode and the luminance angle dependency, for each of the light-emitting elements cited in Tables 1 to 3 and formed on the substrate as a support.

FIG. 5 is a graph illustrating a relationship between the number of the reflective layers of the first electrode 22G and the luminance angle dependency, for each of the light-emitting elements ESG cited in Tables 1 to 3 and formed on the substrate as a support. Note that, in this embodiment, the angle dependency is a relationship between an angle and a ratio of a luminance to a front luminance, where the front is set 0° and the front luminance of a light-emitting element ES including one light-emitting layer alone is set 100%. Hence, in FIG. 5, the relative luminance is a luminance where the front luminance of the light-emitting element ESG cited in Table 1 is set 100%.

As illustrated in FIG. 5, when the light-emitting element ESG, whose first electrode 22G is provided with only one reflective layer, is viewed from an oblique direction at an angle of 45° with respect to the front direction, the luminance decreases to approximately one fifth of the luminance obtained when the light-emitting element ESG is viewed from the front direction. However, when the light-emitting element ESG, whose first electrode 22G is provided with a plurality of reflective layers, is viewed from an oblique direction at an angle of 45° with respect to the front direction, the obtained luminance can be a half or more of the luminance obtained when the light-emitting element ESG is viewed from the front direction.

Figure 6:
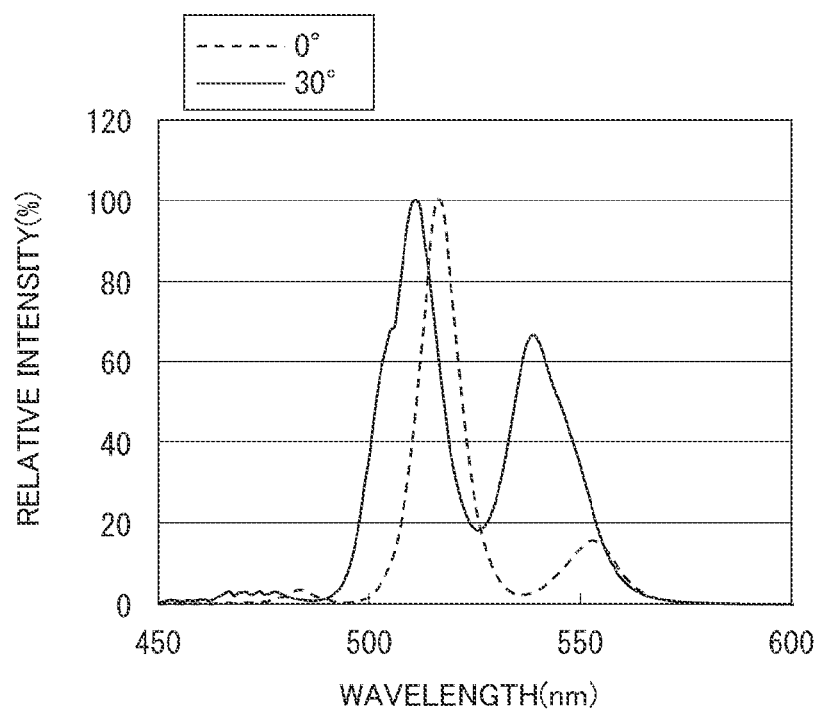
FIG. 6 is a graph illustrating the angle dependency of an emission spectrum in using a green light-emitting element including three reflective layers. The relative intensity is put on the vertical axis.
Figure 7:
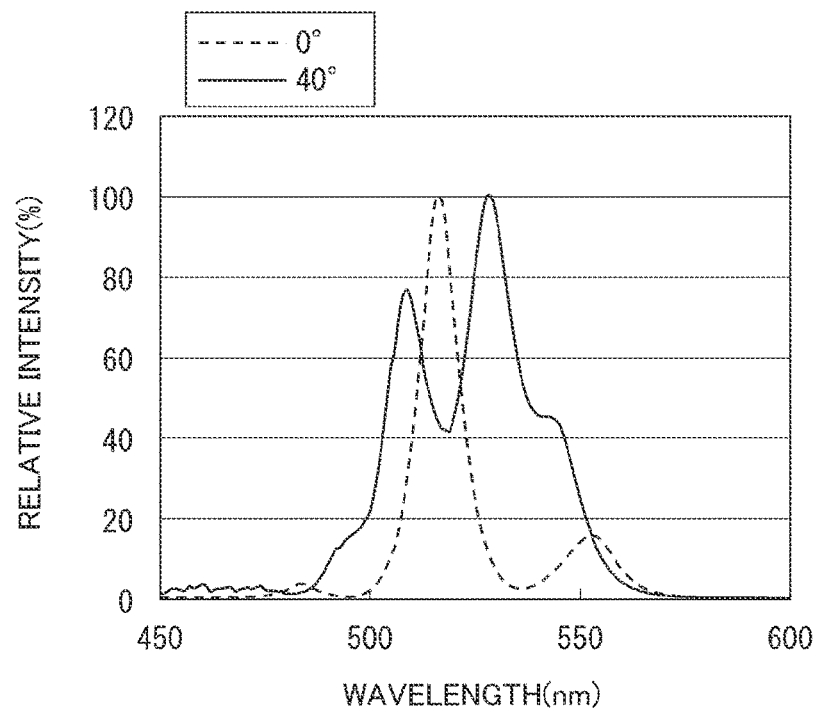
FIG. 7 is another graph illustrating the angle dependency of the emission spectrum in using the green light-emitting element including three reflective layers. The relative intensity is put on the vertical axis.
Figure 8:
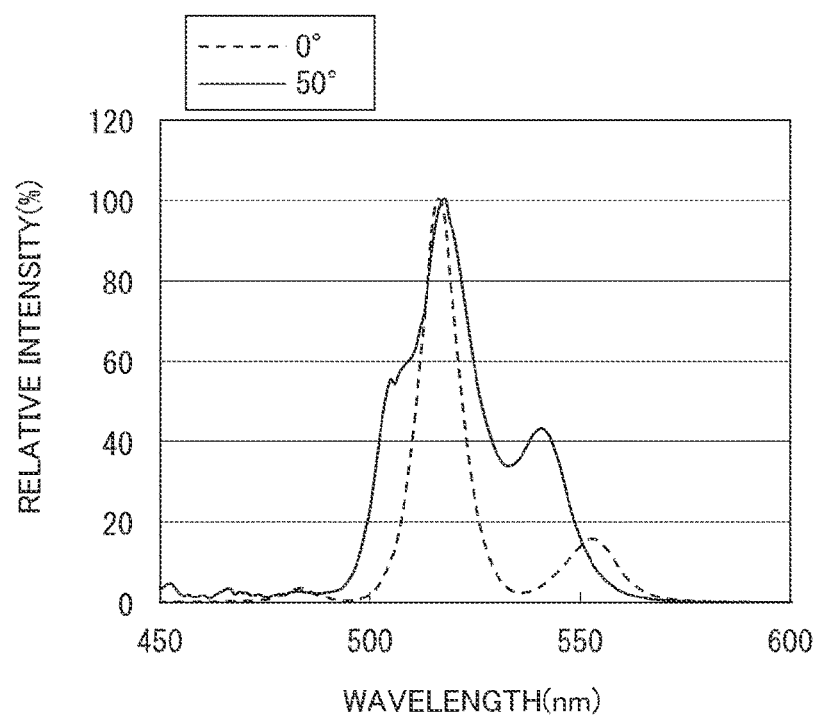
FIG. 8 is still another graph illustrating the angle dependency of the emission spectrum in using the green light-emitting element including three reflective layers. The relative intensity is put on the vertical axis.

A conceivable reason is presented below. FIGS. 6 to 8 are graphs each illustrating the angle dependency of an emission spectrum in using, as the light-emitting element ESG, a light-emitting element ESG including three reflective layers. The relative intensity is put on the vertical axis. Note that the above light-emitting element ESG is the same as the light-emitting element ESG cited in Table 3 except that, in the light-emitting element ESG, the second $RM31G_2$ in the middle reflective layer has a thickness of 45 nm. FIG. 6 shows relative intensities of an emission spectrum when the above light-emitting element ESG is viewed at an angle of 0° (i.e. when directly viewed from the front) and at an angle of 30°. FIG. 7 shows relative intensities of an emission spectrum when the above light-emitting element is ESG viewed at an angle of 0° and at an angle of 40°. FIG. 8 shows relative intensities of an emission spectrum when the above light-emitting element ESG is viewed at an angle of 0° and at an angle of 50°. Note that, in FIGS. 6 to 8, the relative intensity is an emission intensity of each emission peak where the emission intensity of each main emission peak is set 100% when the above light-emitting element ESG is viewed from the front direction and an oblique direction.

Although not shown, as to the emission spectrum of the light-emitting element ES, the intensity of the main emission peak decreases in the oblique direction compared with in the front direction. However, as illustrated in FIGS. 6 to 8, as to the emission spectrum of the light-emitting element ES, the intensities of the sub emission peaks with respect to the main emission peak increase in an oblique direction compared with in the front direction. Hence, by these sub emission peaks, the decrease in the intensity of the main emission peak can be interpolated, making it possible to reduce a decrease in the luminance in an oblique direction.

Note that, in this embodiment, as described before, the number of the emission peaks can be adjusted by the number of the reflective layers. Moreover, as described before, the position of a sub emission peak can be adjusted by the thickness of the TE 32 of a reflective layer other than the uppermost reflective layer. Furthermore, the position of the main emission peak can be adjusted by the distance between the RM 31 of the uppermost reflective layer in the first electrode 22 and the second electrode 25.

Hence, the number of the emission peaks and the emission wavelengths of the main emission peak and the sub emission peaks shall not be limited to a particular number and particular wavelengths as long as the main emission peak and the sub emission peaks are provided to the wavelength band of a color of the light emitted from each of the light-emitting elements ES.

Thus, the light-emitting elements ESG according to this embodiment shall not be limited to the examples shown in FIGS. 3 and 4. However, as illustrated in FIG. 3, the light-emitting element ESG according to this embodiment desirably has: the main emission peak in a wavelength band of, for example, 510 nm or more and less than 580 nm; and the sub emission peak in a wavelength band of, for example, 470 nm or more and less than 530 nm. Moreover, as illustrated in FIG. 4, the light-emitting element ESG according to this embodiment desirably has: the main emission peak in a wavelength band of, for example, 500 nm or more and less than 550 nm; and sub emission peaks each in one of a wavelength band of, for example, 470 nm or more and less than 510 nm and a wavelength band of, for example, 530 nm or more and less than 580 nm.

Figure 9:
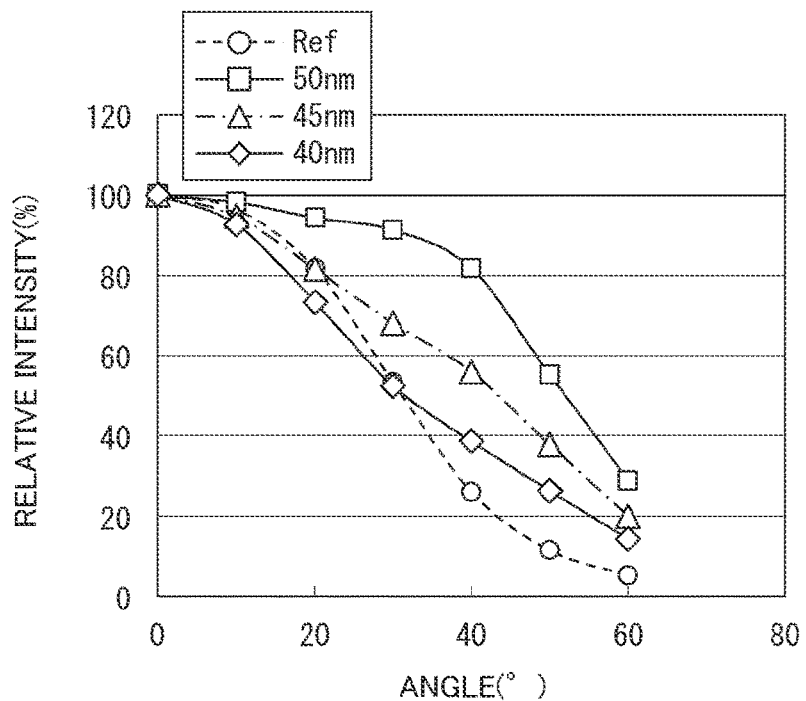
FIG. 9 is a graph collectively illustrating: the luminance angle dependency observed when a thickness of a second reflective metal film of the light-emitting element cited in Table 3 varies within a range from 40 to 50 nm; and the luminance angle dependency of the light-emitting element cited in Table 1.

Moreover. FIG. 9 is a graph collectively illustrating: the luminance angle dependency observed when the thickness of the second RM 31G$_2$ of the light-emitting element ESG cited in Table 3 varies within a range from 40 to 50 nm; and the luminance angle dependency of the light-emitting element ESG cited in Table 1. Note that the luminance angle dependency of the light-emitting element ESG cited in Table 1 is referred to as "Ref" in FIG. 9.

As illustrated in FIG. 9, the more the thickness of the second RM 31G$_2$ as a half mirror is, the less the width in the luminance variation with respect to the front luminance is when viewed from an oblique direction. The less the thickness is, the less the influence is on the luminance angle dependency.

Note that the same as the light-emitting element ESG applies to the light-emitting element ESG and the light-emitting element ESB.

Figure 10:
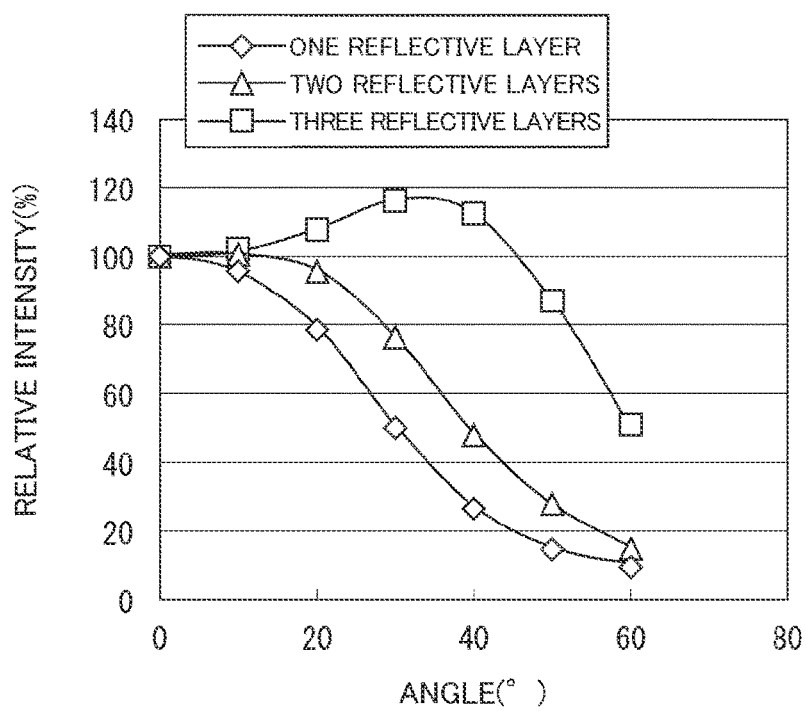
FIG. 10 is a graph illustrating a relationship between the number of the reflective layers of the first electrode and the luminance angle dependency, for each of the light-emitting elements cited in Tables 4 to 6 and formed on the substrate as a support.

FIG. 10 is a graph illustrating a relationship between the number of the reflective layers of the first electrode 22R and the luminance angle dependency, for each of the light-emitting elements ESR cited in Tables 4 to 6 and formed on the substrate as a support. In FIG. 10, the relative luminance is a luminance observed where the front luminance of the light-emitting element ESR, which is cited in Table 4 below and having only one light-emitting layer, is set 100%.

TABLE 4

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46R | 0.5 | 1.39 | 0.0 |
| ETL 45R | 15 | 1.86 | 0.0 |
| HBL 4R | 40 | 1.77 | 0.0 |
| EML 43R | 20 | 1.75 | 0.0 |
| HTL 42R | 10 | 1.78 | 0.0 |
| HIL 41R | 180 | 1.75 | 0.0 |
| First TE 32R$_1$ | 19 | 2.15 | 0.0 |
| First RM 31R$_1$ | 80 | 0.09 | 3.1 |
| Substrate | $7.00 \times 10^5$ | 1.52 | 0.0 |

TABLE 5

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46R | 0.5 | 1.39 | 0.0 |
| ETL 45R | 15 | 1.86 | 0.0 |
| HBL 4R | 40 | 1.77 | 0.0 |
| EML 43R | 20 | 1.75 | 0.0 |
| HTL 42R | 10 | 1.78 | 0.0 |
| HIL 41R | 180 | 1.75 | 0.0 |
| Second TE 32R$_2$ | 19 | 2.15 | 0.0 |
| Second RM 31R$_2$ | 40 | 0.09 | 3.1 |
| First TE 32R$_1$ | 80 | 2.15 | 0.0 |
| First RM 31R$_1$ | 80 | 0.09 | 3.1 |
| Substrate | $7.00 \times 10^5$ | 1.52 | 0.0 |

TABLE 6

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46R | 0.5 | 1.39 | 0.0 |
| ETL 45R | 15 | 1.86 | 0.0 |
| HBL 4R | 40 | 1.77 | 0.0 |
| EML 43R | 20 | 1.75 | 0.0 |
| HTL 42R | 10 | 1.78 | 0.0 |
| HIL 41R | 180 | 1.75 | 0.0 |
| Third TE 32R$_3$ | 19 | 2.15 | 0.0 |
| Third RM 31R$_3$ | 30 | 0.09 | 3.1 |
| Second TE 32R$_2$ | 80 | 2.15 | 0.0 |
| Second RM 31R$_2$ | 50 | 0.09 | 3.1 |
| First TE 32R$_1$ | 80 | 2.15 | 0.0 |
| First RM 31R$_1$ | 80 | 0.09 | 3.1 |
| Substrate | $7.00 \times 10^5$ | 1.52 | 0.0 |

Note that, in Tables 4 to 6, the first RM 31R$_1$, the second RM 31R$_2$, and the third RM 31R$_3$ are Ag films. Moreover, the first TE 32R$_1$, the second TM 32R$_2$, and the third TM 32R$_3$ are ITO films. The HIL 41R is a hole-injection layer made of an organic material. The HTL 42R is a hole-transport layer made of an organic material. The EML 43R is a light-emitting layer made of an organic material containing a dopant. The HBL 4R is a hole-blocking layer made of an organic material. The ETL 45R is an electron-transport layer made of an organic material. The EIL 46R is an electron-injection layer having a low work function. The translucent electrode 51 is an electrode made of an alloy material containing a metallic material (e.g. Mg) having a low work function. The transparent electrode 52 is a semi-metallic electrode such as Ag. The organic cap layer 61 is a capping layer made of an organic material and having a large refractive index. The inorganic cap layer 62 is a capping layer made of LiF and having a low refractive index.

As illustrated in FIG. 10, when the light-emitting element ESR, whose first electrode 22R is provided with only one reflective layer, is viewed from an oblique direction at an angle of 45° with respect to the front direction, the luminance decreases to approximately one fifth of the luminance obtained when the light-emitting element ESR is viewed from the front direction. However, as to the light-emitting element ESR, whose first electrode 22R is provided with a plurality of reflective layers, there is an increase in the relative luminance observed in an oblique direction at an angle of 45° with respect to the front direction, compared with the light-emitting element ESR whose first electrode 22R is provided with only one reflective layer.

A light-emitting element ESR according to this embodiment desirably has: the main emission peak in a wavelength band of, for example, 600 nm or more and less than 800 nm; and the sub emission peak in a wavelength band of, for example, 580 nm or more and less than 625 nm. Moreover, a light-emitting element ESR according to this embodiment desirably has: the main emission peak in a wavelength band of, for example, 600 nm or more and less than 800 nm; and sub emission peaks each in one of a wavelength band of, for example, 580 nm or more and less than 625 nm and a wavelength band of, for example, 650 nm or more and less than 800 nm.

Figure 11:
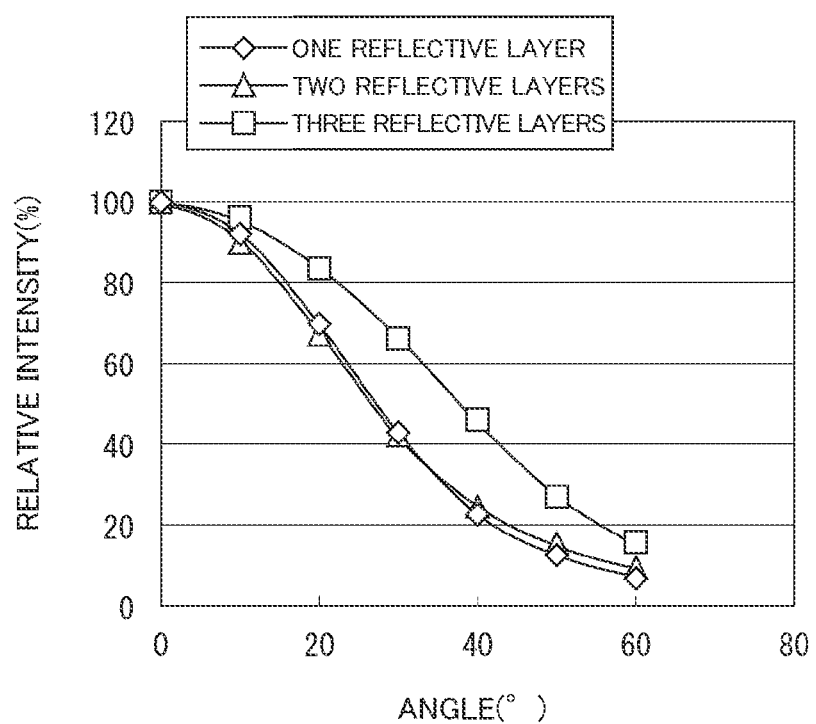
FIG. 11 is a graph illustrating a relationship between the number of the reflective layers of the first electrode and the luminance angle dependency, for each of the light-emitting elements cited in Tables 7 to 9 and formed on the substrate as a support.

Furthermore, FIG. 11 is a graph illustrating a relationship between the number of the reflective layers of the first electrode 22B and the luminance angle dependency, for the light-emitting elements ESB each cited in Tables 7 to 9 and formed on the substrate as a support. In FIG. 11, the relative luminance is a luminance where the front luminance of the light-emitting element ESB cited in Table 7 and having only one light-emitting layer is set 100%.

TABLE 7

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46B | 0.5 | 1.39 | 0.0 |
| ETL 45B | 15 | 1.86 | 0.0 |
| HBL 4B | 25 | 1.77 | 0.0 |
| EML 43B | 10 | 1.8 | 0.0 |
| HTL 42B | 10 | 1.78 | 0.0 |
| HIL 41B | 115 | 1.75 | 0.0 |
| First TE $32B_1$ | 19 | 2.15 | 0.0 |
| First RM $31B_1$ | 40 | 0.09 | 3.1 |
| Substrate | $7.00 \times 10^5$ | 1.52 | 0.0 |

TABLE 8

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46B | 0.5 | 1.39 | 0.0 |
| ETL 45B | 15 | 1.86 | 0.0 |
| HBL 4B | 25 | 1.77 | 0.0 |
| EML 43B | 10 | 1.8 | 0.0 |
| HTL 42B | 10 | 1.78 | 0.0 |
| HIL 41B | 115 | 1.75 | 0.0 |
| Second TE $32B_2$ | 19 | 2.15 | 0.0 |
| Second RM $31B_2$ | 40 | 0.09 | 3.1 |
| First TE $32B_1$ | 80 | 2.15 | 0.0 |
| First RM $31B_1$ | 80 | 0.09 | 3.1 |
| Substrate | $7.00 \times 10^5$ | 1.52 | 0.0 |

TABLE 9

| Layer | Thickness (nm) | Refractive Index (at 500.0 nm) | Absorption Coefficient |
|---|---|---|---|
| Inorganic Cap Layer 62 | 1 | 1 | 0.0 |
| Organic Cap Layer 61 | 78 | 1.85 | 0.0 |
| Transparent Electrode 52 | 24 | 0 | 2.8 |
| Translucent Electrode 51 | 1 | 0.33 | 3.1 |
| EIL 46B | 0.5 | 1.39 | 0.0 |
| ETL 45B | 15 | 1.86 | 0.0 |
| HBL 4B | 25 | 1.77 | 0.0 |
| EML 43B | 10 | 1.8 | 0.0 |
| HTL 42B | 10 | 1.78 | 0.0 |
| HIL 41B | 115 | 1.75 | 0.0 |
| Third TE $32B_3$ | 19 | 2.15 | 0.0 |
| Third RM $31B_3$ | 20 | 0.09 | 3.1 |
| Second TE $32B_2$ | 40 | 2.15 | 0.0 |
| Second RM $31B_2$ | 40 | 0.09 | 3.1 |
| First TE $32B_1$ | 80 | 2.15 | 0.0 |
| First RM $31B_1$ | 80 | 0.09 | 3.1 |
| Substrate | $7.00 \times 10^5$ | 1.52 | 0.0 |

Note that, in Tables 7 to 9, the first RM $31B_1$, the second RM $31B_2$, and the third RM $31B_3$ are Ag films. Moreover, the first TE $32B_1$, the second TM $32B_2$, and the third TM $32B_3$ are ITO films. The HIL 41B is a hole-injection layer made of an organic material. The HTL 42B is a hole-transport layer made of an organic material. The EML 43B is a light-emitting layer made of an organic material containing a dopant. The HBL 4B is a hole-blocking layer made of an organic material. The ETL 45B is an electron-transport layer made of an organic material. The EIL 46B is an electron-injection layer having a low work function. The translucent electrode 51 is an electrode made of an alloy material containing a metallic material (e.g. Mg) having a low work function. The transparent electrode 52 is a semi-metallic electrode such as Ag. The organic cap layer 61 is a capping layer made of an organic material and having a large refractive index. The inorganic cap layer 62 is a capping layer made of LiF and having a low refractive index.

As illustrated in FIG. 11, when the light-emitting element ESB, whose first electrode 22B is provided with only one reflective layer, is viewed from an oblique direction at an angle of 45° with respect to the front direction, the luminance decreases to approximately one fifth of the luminance obtained when the light-emitting element ESB is viewed from the front direction. As to the light-emitting element ESB, whose first electrode 22B is provided with two reflective layers, there is an increase in the relative luminance observed in an oblique direction at an angle of 45° with respect to the front direction, compared with the light-emitting element ESB whose first electrode 22B is provided with only one reflective layer. Still, the increase is only a slight one. However, compared with the light-emitting element ESB whose first electrode 22B is provided with only one reflective layer, the light-emitting element ESB whose first electrode 22B is provided with three reflective layers exhibits a significant increase in relative luminance when viewed from an oblique direction at an angle of 45° with respect to the front direction.

The light-emitting element ESB according to this embodiment desirably has: the main emission peak in a wavelength band of, for example, 420 nm or more and less than 470 nm; and the sub emission peak in a wavelength band of, for example, 380 nm or more and less than 440 nm. Moreover, the light-emitting element ESB according to this embodiment desirably has: the main emission peak in a wavelength band of, for example, 420 nm or more and less than 470 nm; and sub-emission peaks each in one of a wavelength band of, for example, 380 nm or more and less than 440 nm and a wavelength band of, for example, 440 nm or more and less than 470 nm.

Note that, in this embodiment, as to the angle dependencies illustrated in FIGS. 5 to 11, the luminance of emitted light is estimated (simulated) using a simulator "SETFOS" manufactured by Cybernet Systems Co., Ltd. Moreover, as to the emission spectra illustrated in FIGS. 3 and 4, the emission intensity is estimated for each wavelength using the above simulator "SETFOS" manufactured by Cybernet Systems Co., Ltd.

As can be seen, according to this embodiment, the first electrode 22 is multilayered to have the RMs 31 and the TEs 32 repeatedly stacked. Such a feature can relax conditions of the optical interference, and can further relax the luminance angle dependency. Thus, compared with a known case where a thick metal layer that sufficiently blocks light is provided alone, the display device 1 according to this embodiment can reduce directivity of the light while maintaining the front luminance, and can reduce the luminance variation (the decrease in luminance) when viewed from an oblique direction. Hence, the display device 1 according to this embodiment can reduce a tinge in a white glow when viewed from an oblique direction.

Note that, if the display device 1 is a bottom-emission display device and second electrode 25 is multilayered, the surface resistance of the second electrode 25 increases, causing such harmful effects as poor luminance distribution in the surface and an increase in IR drop. However, this embodiment can improve the optical property without such harmful effects.

<Modification 1>

Note that FIG. 1 exemplifies a case where each of the light-emitting elements ESR, ESG, and ESB includes three reflective layers. However, this embodiment shall not be limited to such an example. As described above, if the first electrode 22 is multilayered, the number of the emission peaks increases in proportion to the number of the reflective layers. Such a feature can reduce a decrease in luminance in an oblique direction. Hence, each of the light-emitting elements ESR, ESG, and ESB may include two reflective layers described above. Alternatively, only one or two of the light-emitting elements ES may include two or more reflective layers. That is, in this embodiment, at least one light-emitting element ES among the light-emitting elements ESR, ESG, and ESB may include a plurality of the reflective layers. Such a feature can reduce a decrease in luminance in an oblique direction, and reduce or eliminate a tinge in the oblique direction as compared with a known technique.

<Modification 2>

Moreover, this embodiment exemplifies a case where each of the light-emitting elements ESR, ESG, and ESB includes two or three reflective layers. However, this embodiment shall not be limited to this example. Each light-emitting element may include four or more reflective layers. As can be seen, when the first electrode 22 is multilayered, the emission spectra produce multiple peaks, reducing variation in luminance when the display device 1 is viewed at angle. Thanks to such a feature, the above effect can be achieved when the first electrode 22 is multilayered of four layers or more. Hence, the upper limit of the number of the reflective layers included in the first electrode 22 shall not be limited to a particular number in view of reducing the variation in luminance when the display device 1 is viewed at angle. However, when the number of the reflective layers increases, the number of production steps increases, thereby causing such problems as increases in the number of processes and costs. Hence, practically, the number of the reflective layers is desirably three or less.

<Modification 3>

Furthermore, this embodiment exemplifies a case where the first electrode 22 is an anode, and the anode is multilayered. However, this embodiment shall not be limited to this example. The first electrode 22 may be a cathode, and the cathode may be multilayered. In such a case, as seen in the case where the first electrode 22 is the anode, the emission spectra produce multiple peaks, reducing variation in luminance when the display device 1 is viewed at angle.

Second Embodiment

This embodiment describes a difference from the first embodiment. Note that, for the sake of convenience, identical reference signs are used to denote members having identical functions between this embodiment and the first embodiment. Such members shall not be elaborated upon here.

Figure 12:
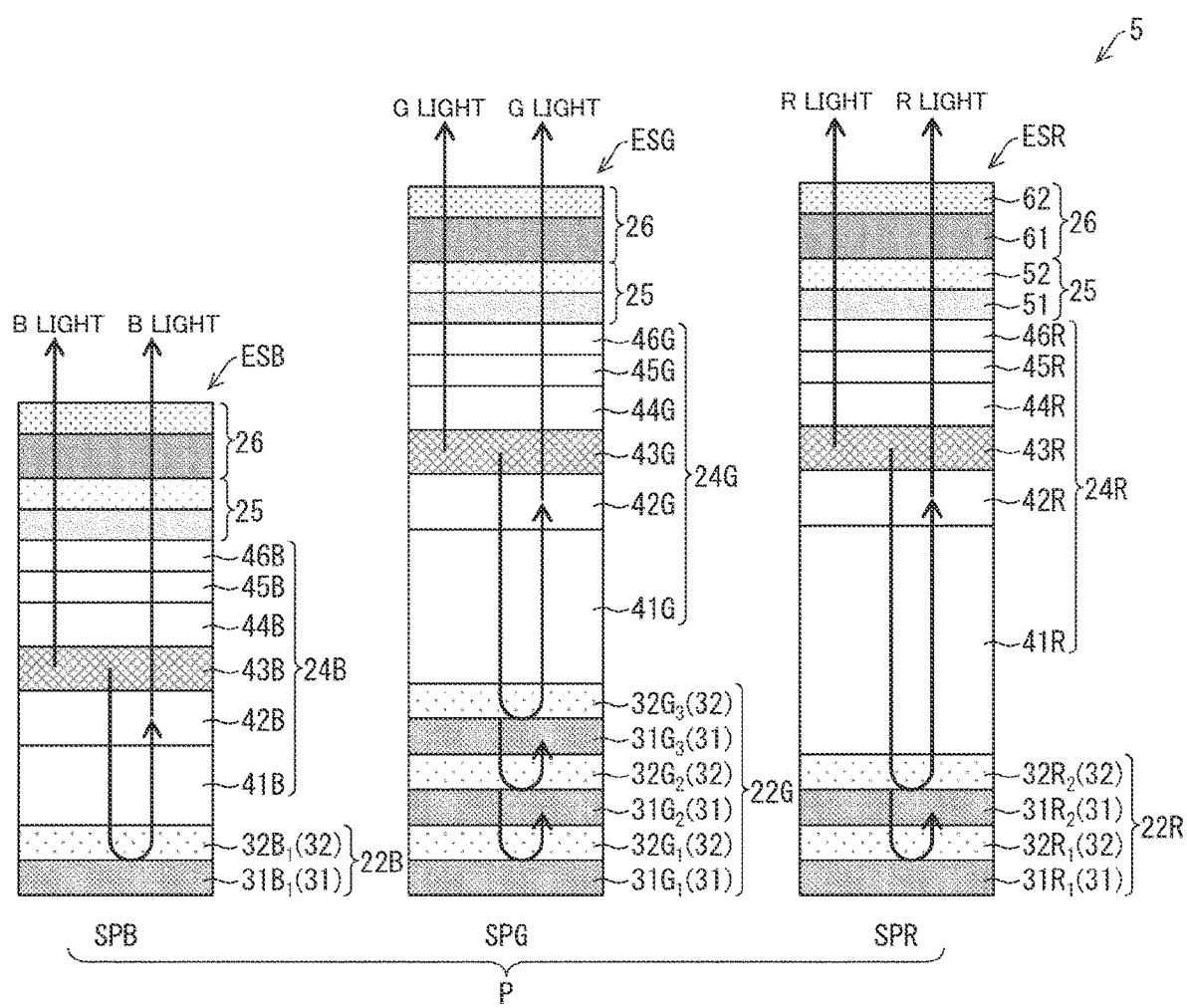
FIG. 12 is a drawing schematically illustrating multilayer structures of the colored light-emitting elements in the light-emitting-element layer of the display device according to a second embodiment.

FIG. 12 is a drawing schematically illustrating multilayer structures of the colored light-emitting elements ES in the light-emitting-element layer 5 of the display device 1 according to this embodiment.

As described in the first embodiment, in the display device 1, at least one light-emitting element ES among the light-emitting elements ESR, ESG, and ESB may include a plurality of the reflective layers. Alternatively, only one or two of the light-emitting elements ES may include two or more reflective layers.

In particular, when white is synthesized, a relative balance between the colors of emitted lights is important. Compared in absolute values, the variation in luminance of green when viewed from an oblique direction is larger than the variation in luminance of the other colors. Hence, when white is synthesized, the green component appears to be reduced, and white is likely to appear reddish when viewed from an oblique direction.

However, as illustrated in FIGS. 5, 10, and 11, if the light-emitting element ESG includes three of the reflective layers, the light-emitting element ESR includes two of the reflective layers, and the light-emitting element ESB includes one of the reflective layers, the waveforms showing the angle dependency of luminance are substantially the same. Hence, as illustrated in FIG. 12, the light-emitting element ESG includes three of the reflective layers, the light-emitting element ESR includes two of the reflective layers, and the light-emitting element ESB include one of the reflective layers. Such a feature can provide the display device with a good color balance obtained when a white light is emitted.

The present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the present disclosure. Moreover, the technical aspects disclosed in each embodiment may be combined to achieve a new technical feature.

The invention claimed is:

1. A display device, comprising:
   a thin-film transistor layer including a plurality of thin-film transistors;
   a light-emitting element layer including a plurality of light-emitting elements, each emitting light in a different color; and
   a sealing layer that covers the light-emitting element layer,
   wherein each of the plurality of light-emitting elements includes: a first electrode; a functional layer including a light-emitting layer; and a second electrode, all of which are provided on the thin-film transistor layer in a stated order from the thin-film transistor layer,
   the first electrode included each of the plurality of light-emitting elements includes a plurality of reflective layers, each including a reflective metal film and a transparent electrode film stacked on the reflective metal film,
   the plurality of the reflective layers is stacked, such that the reflective metal film and the transparent electrode film are alternately arranged in a stated order from the thin-film transistor layer,
   the plurality of light-emitting elements includes: a blue light-emitting element configured to emit light in blue; a red light-emitting element configured to emit light in red; and a green light-emitting element configured to emit light in green,
   the blue light-emitting element includes one of the plurality of reflective layers,
   the red light-emitting element includes two of the plurality of reflective layers, and
   the green light-emitting element includes three of the plurality of reflective layers.

2. The display device according to claim 1,
   wherein, an emission spectrum of at least one of the plurality of light-emitting elements has: a main emission peak that is a largest emission peak; and at least one sub-emission peak smaller than the main emission peak.

3. The display device according claim 1,
   wherein the reflective metal film is a silver film.

4. The display device according to claim 3,
   wherein the transparent electrode film is an ITO film.

5. The display device according to claim 1,
   wherein, among the plurality of the reflective layers, the transparent electrode film of an uppermost reflective layer is thinner than the reflective metal film directly below the transparent electrode film of the uppermost reflective film.

6. The display device according to claim 1,
   wherein, among the plurality of the reflective layers, the reflective metal film of an uppermost reflective layer is thinner than the reflective metal film of a lowermost reflective layer.

7. The display device according to claim 1,
   wherein, among the plurality of the reflective layers, the reflective metal film of an uppermost reflective layer is thinner than the transparent electrode film of a lowermost reflective layer.

8. The display device according to claim 1,
   wherein, among the plurality of the reflective layers, the transparent electrode film of an uppermost reflective layer has a thickness ranging between 10 nm or more and 100 nm or less.

9. The display device according to claim 1,
   wherein, among the plurality of the reflective layers, the transparent electrode film of a reflective layer other than an uppermost reflective layer has a thickness ranging between 10 nm or more and 100 nm or less.

10. The display device according to claim 1,
    wherein, among the plurality of the reflective layers, the reflective metal film of a lowermost reflective layer has a thickness ranging between 80 nm or more and 120 nm or less.

11. The display device according to claim 1,
    wherein, among the plurality of the reflective layers, the reflective metal film of a reflective layer other than a lowermost reflective layer has a thickness ranging between 10 nm or more and 60 nm or less.

* * * * *